United States Patent
Zhang

(10) Patent No.: US 10,971,433 B2
(45) Date of Patent: Apr. 6, 2021

(54) SURFACE MOUNTED TYPE LEADFRAME AND PHOTOELECTRIC DEVICE WITH MULTI-CHIPS

(71) Applicant: KAISTAR Lighting (Xiamen) Co., Ltd, Xiamen (CN)

(72) Inventor: Jingqiong Zhang, Xiamen (CN)

(73) Assignee: KAISTAR LIGHTING (XIAMEN) CO., LTD., Xiamen (CN)

( * ) Notice: Subject to any disclaimer, the term of this patent is extended or adjusted under 35 U.S.C. 154(b) by 100 days.

(21) Appl. No.: 16/174,310

(22) Filed: Oct. 30, 2018

(65) Prior Publication Data
US 2019/0067170 A1    Feb. 28, 2019

(30) Foreign Application Priority Data
Mar. 29, 2018  (CN) .......................... 201810271296.9

(51) Int. Cl.
| H01L 29/18 | (2006.01) |
| H01L 23/495 | (2006.01) |
| H01L 33/62 | (2010.01) |
| H01L 25/13 | (2006.01) |
| H01L 23/498 | (2006.01) |
| H01L 25/075 | (2006.01) |
| H01L 33/48 | (2010.01) |

(52) U.S. Cl.
CPC .. *H01L 23/49503* (2013.01); *H01L 23/49541* (2013.01); *H01L 23/49575* (2013.01); *H01L 23/49586* (2013.01); *H01L 23/49861* (2013.01); *H01L 25/0753* (2013.01); *H01L 25/13* (2013.01); *H01L 33/62* (2013.01); *H01L 33/486* (2013.01); *H01L 2224/48137* (2013.01)

(58) Field of Classification Search
CPC ............... H01L 23/495; H01L 23/4832; H01L 23/49548
See application file for complete search history.

(56) References Cited

U.S. PATENT DOCUMENTS

2011/0108967 A1\* 5/2011 Bai ...................... H01L 21/4832
                                                          257/676
2016/0005939 A1\* 1/2016 Andrews ................. H01L 33/62
                                                           257/91

FOREIGN PATENT DOCUMENTS

CN          103367344 A       10/2013

\* cited by examiner

*Primary Examiner* — Phuc T Dang
(74) *Attorney, Agent, or Firm* — Hemisphere Law, PLLC; Zhigang Ma

(57) ABSTRACT

A surface mounted type leadframe includes a conductive base and an insulating material layer. The conductive base includes at least three connecting pads spaced apart from each other. First surface of the connecting pads are configured to form die bonding regions, and second surfaces of the connecting pads opposite to the first surfaces are configured to form soldering regions. The insulating material layer at least partially covers the first surfaces, surrounds the die bonding regions, and is filled in a gap between each two adjacent connecting pads. A photoelectric device with multi-chips adopting the surface mounted type leadframe is also provided.

18 Claims, 5 Drawing Sheets

SURFACE MOUNTED TYPE LEADFRAME AND PHOTOELECTRIC DEVICE WITH MULTI-CHIPS

FIELD OF THE DISCLOSURE

The disclosure relates to a photoelectric technical field, and more particularly to a surface mounted type leadframe and a photoelectric device with multi-chips.

BACKGROUND

Nowadays, the size of a surface mounted device (SMD) type light-emitting diode (LED) product is more and more various toward larger sizes with higher powers to substitute chip on board (COB) LED products with lower powers. One characteristic of SMD type products is requiring reflow soldering; LED chips are mounted on the conductive base for electrical connection and heat dissipation. The conventional mounting process is adopting solder paste for reflow soldering, but the void ratio can be overlarge due to pad design, inappropriate reflow soldering profile and so on during reflow soldering, and the overlarge void ratio can easily lead to poor heat dissipation effects. Moreover, when sizes of the SMD type product are larger, each die bonding region will be larger, and the amount of chips in series connection is too large to achieve low voltage (such as 6V) design. Additionally, adhesion strengths of silicone glue, metal and insulating materials are relatively weak, and delamination can easily occur.

Therefore, it is meaningful to provide a surface mounted type leadframe and a photoelectric device to overcome shortcomings in the prior art.

SUMMARY

An embodiment of the disclosure provides a surface mounted type leadframe and a photoelectric device with multi-chips, which can reduce the void ratio of the solder paste of the surface mounted type leadframe with large sizes for improving heat dissipation effects as well as the adhesion between the surface mounted type leadframe and the silicone glue in order to reduce the possibility of delamination, and/or fulfilling the die bonding and wire bonding design under low voltages.

On one hand, the embodiment of the disclosure provides a surface mounted type leadframe, including: a conductive base and an insulating material layer. The conductive base includes at least three connecting pads; the at least three connecting pads are mutually spaced apart from each other. First surfaces of the at least three connecting pads are configured to form die bonding regions, and second surfaces of the at least three connecting pads opposite to the first surfaces are configured to form soldering regions. At least one of the at least three connecting pads is anode and the other connecting pads are cathode; the insulating material layer at least partially covers the first surface of the conductive base and surrounds the die bonding regions as well as being filled in a gap between any two adjacent connecting pads.

In an embodiment of the disclosure, the at least three connecting pads include a number of anode connecting pads and a number of cathode connecting pads.

In an embodiment of the disclosure, the at least three connecting pads include even connecting pads. A half of the even connecting pads are anode and the other half are cathode.

In an embodiment of the disclosure, anode connecting pads and cathode connecting pads are alternately disposed.

In an embodiment of the disclosure, the conductive base further includes at least one connecting rib. A number of connecting pads with an identical polarity are communicated by one of the at least one connecting rib.

In an embodiment of the disclosure, the conductive base further includes two connecting ribs. The anode connecting pads are communicated by one of the two connecting ribs, and the cathode connecting pads are communicated by the other one of the two connecting ribs; the two connecting ribs are respectively located at two opposite sides of the conductive base.

In an embodiment of the disclosure, the insulating material layer at least partially covers the at least one connecting rib. Four lateral sides of each first surface connecting pad have a portion uncovered by the insulating material layer.

On the other hand, the embodiment of the disclosure provides a surface mounted type leadframe, including a conductive base and an insulating material layer. The conductive base includes a number of connecting pads; first surfaces of the connecting pads are configured to form die bonding regions, and second surfaces of the connecting pads opposite to the first surfaces are configured to form soldering regions; the insulating material layer includes a peripheral section and intermediate sections; the peripheral section at least partially covers the first surface of the conductive base and surrounds the die bonding regions. The intermediate sections are filled in gaps between each two adjacent connecting pads, and the intermediate sections are extruded out from the first surfaces of the plurality of connecting pads.

In an embodiment of the disclosure, a height of the intermediate sections extruded out from the first surfaces of the connecting pads is in a range of 50 microns to 100 microns.

Additionally, the embodiment of the disclosure provides a photoelectric device with multi-chips, including: the surface mounted type leadframe as described in any of the embodiments above and numerous photoelectric chips disposed in the die bonding regions of the surface mounted type leadframe.

In conclusion, the redesign of the structure of the surface mounted type leadframe according to the embodiments of the disclosure above can reduce the void ratio of the solder paste of the surface mounted type leadframe for improving the heat dissipation effect, enhancing the adhesion between the surface mounted type leadframe and the silicone glue to reduce the possibility of delamination, and/or achieving the die bonding and wire bonding design under low voltages.

BRIEF DESCRIPTION OF THE DRAWINGS

In order to more clearly illustrate technical solutions in embodiments of the disclosure, the drawings required in description of the embodiments will be briefly introduced. Apparently, the described drawings below are just some embodiments of the disclosure, and a person skilled in the art can obtain other drawings according to these drawings without any inventive work.

DETAILED DESCRIPTION OF PREFERRED EMBODIMENTS

Technical solutions in embodiments of the disclosure will be described clearly with reference to the accompanying drawings in the embodiments of the disclosure as follows. Apparently, the described embodiments are merely some embodiments of the disclosure rather than all of the embodiments. Based on the embodiments in the disclosure, all the other embodiments obtained by a person skilled in the art without any creativity should belong to the protective scope of the disclosure.

First Embodiment

Figure 1A:
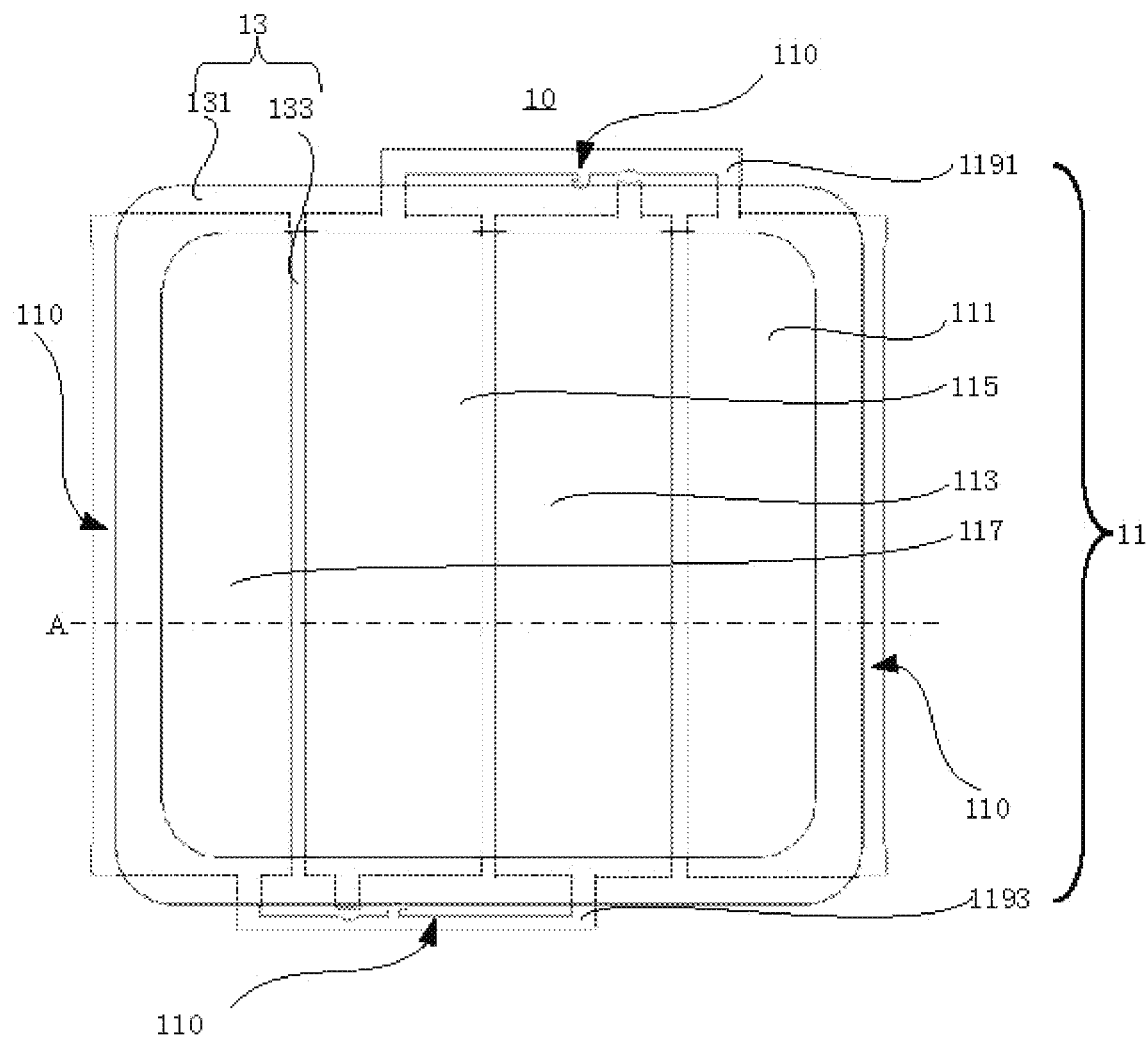
FIG. 1A is a structural schematic front view of a surface mounted type leadframe in an embodiment of the disclosure.
Figure 1B:
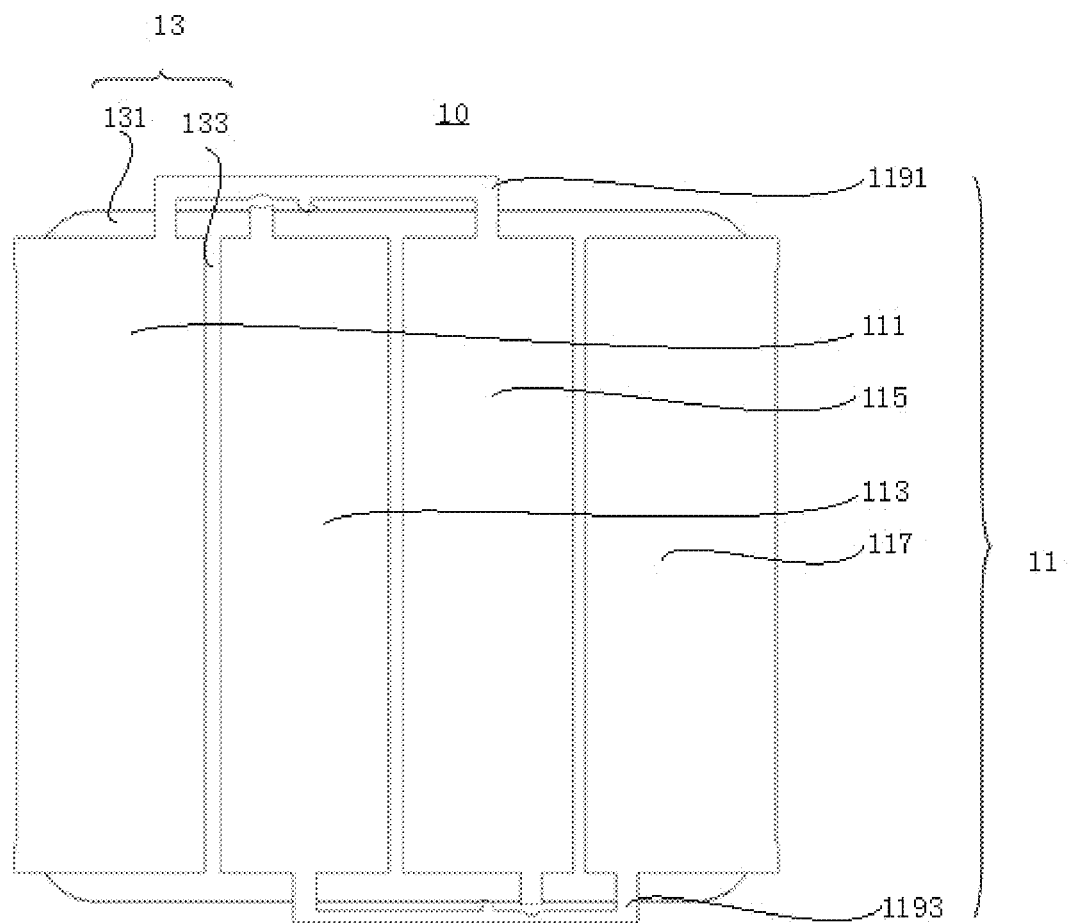
FIG. 1B is a structural schematic rear view of the surface mounted type leadframe in FIG. 1.
Figure 1C:
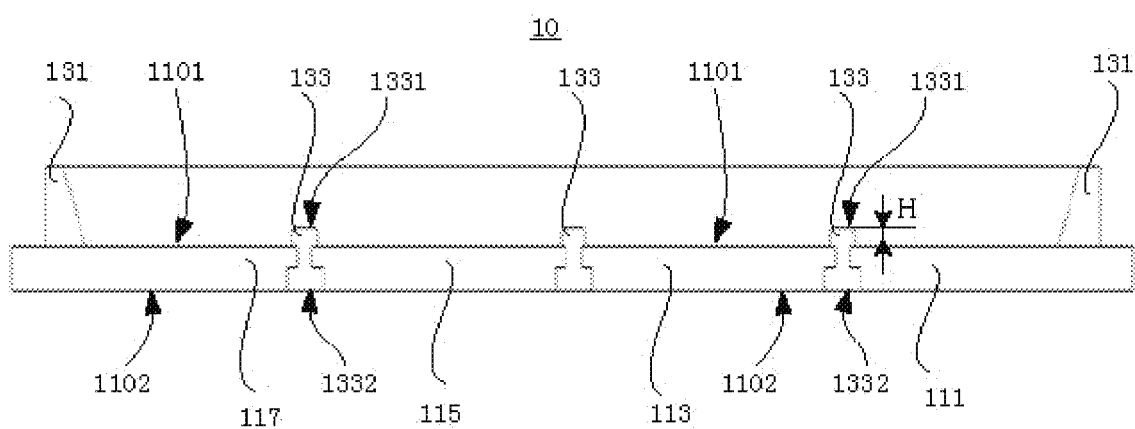
FIG. 1C is a cross-sectional view of the surface mounted type leadframe taken along a line A in FIG. 1.

As shown in FIG. 1A, FIG. 1B and FIG. 1C, a surface mounted type leadframe 10 provided by the first embodiment of the disclosure primarily includes a conductive base 11 and an insulating material layer 13.

The conductive base 11 includes numerous connecting pads, for example, a connecting pad 111, a connecting pad 113, a connecting pad 115, and a connecting pad 117 arranged along a line and equally spaced apart from each other as shown in FIG. 1A. The shape of the connecting pad 111, the connecting pad 113, the connecting pad 115, and the connecting pad 117 is approximately rectangular. Front surfaces 1101 of the connecting pad 111, the connecting pad 113, the connecting pad 115, and the connecting pad 117, as shown in FIG. 1A, can be used to form die bonding regions, and the die bonding regions are configured to assemble photoelectric chips such as LED chips. Rear surfaces 1102 of the connecting pad 111, the connecting pad 113, the connecting pad 115, and the connecting pad 117, as shown in FIG. 1B, can be used to form soldering regions. The conductive pads 111, 113, 115, and 117 are positioned coplanar and have a same height, as such the front surfaces 1101 of the connecting pads are coplanar to form a front surface of the conductive base 11, and the rear surfaces 1102 of the connecting pads are coplanar to form a rear surface of the conductive base 11.

It is worthy to be mentioned that the number of the connecting pads included in the conductive base 11 is not restricted to four as shown in FIGS. 1A, 1B and 1C. The number can further be no less than three; preferably, the number of connecting pads included in the conductive base 11 is an even number no less than three. The material of the conductive base 11 can be conductive metal.

Figure 1D:
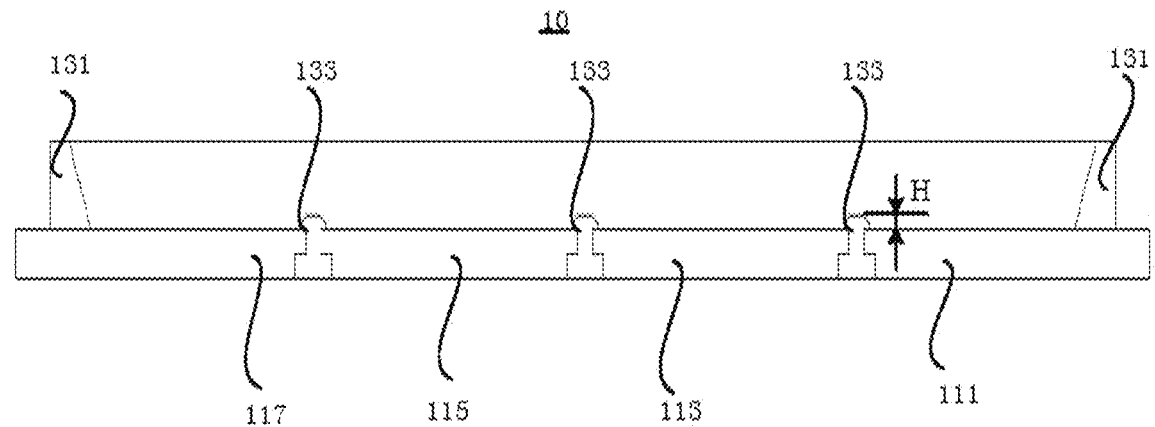
FIG. 1D is a partial cross-sectional view of a surface mounted type leadframe in another embodiment of the disclosure.
Figure 1E:
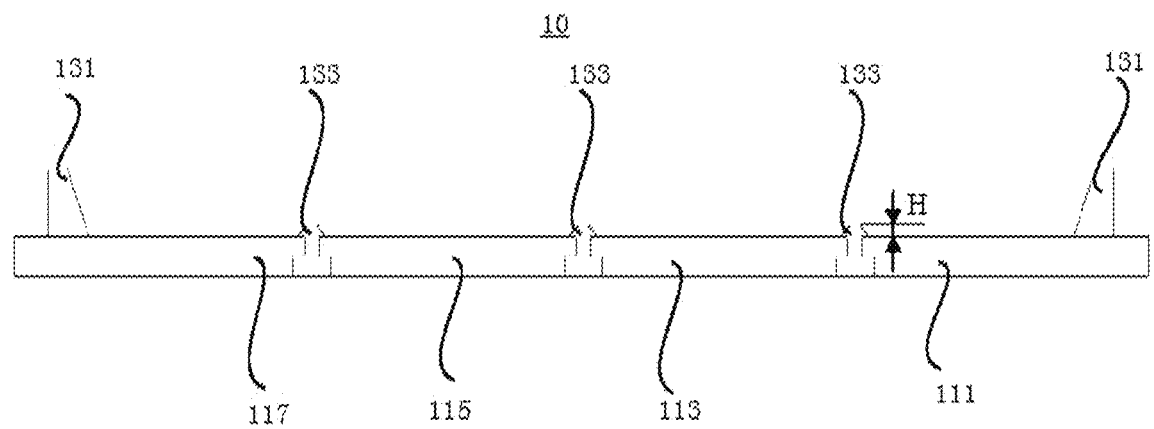
FIG. 1E is a partial cross-sectional view of a surface mounted type leadframe in another embodiment of the disclosure.
Figure 1F:
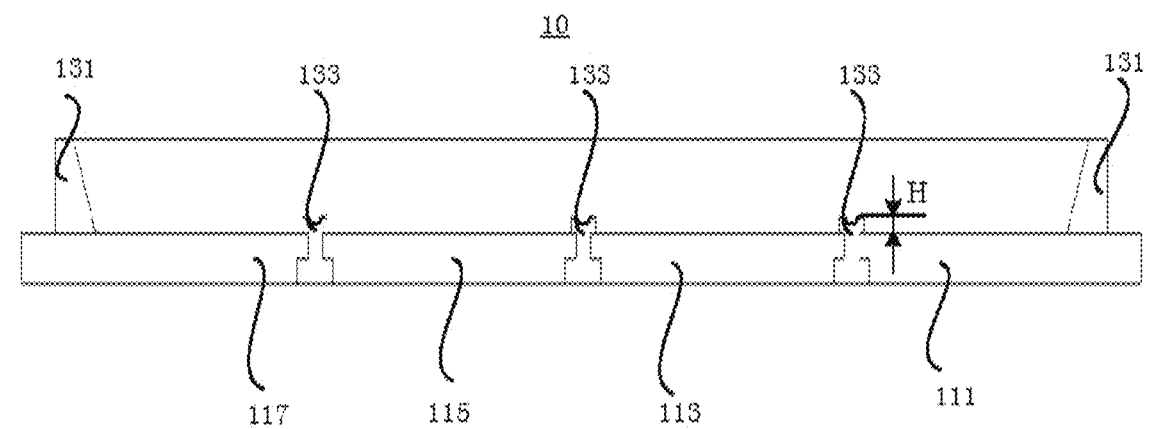
FIG. 1F is a partial cross-sectional view of a surface mounted type leadframe in another embodiment of the disclosure.
Figure 1G:
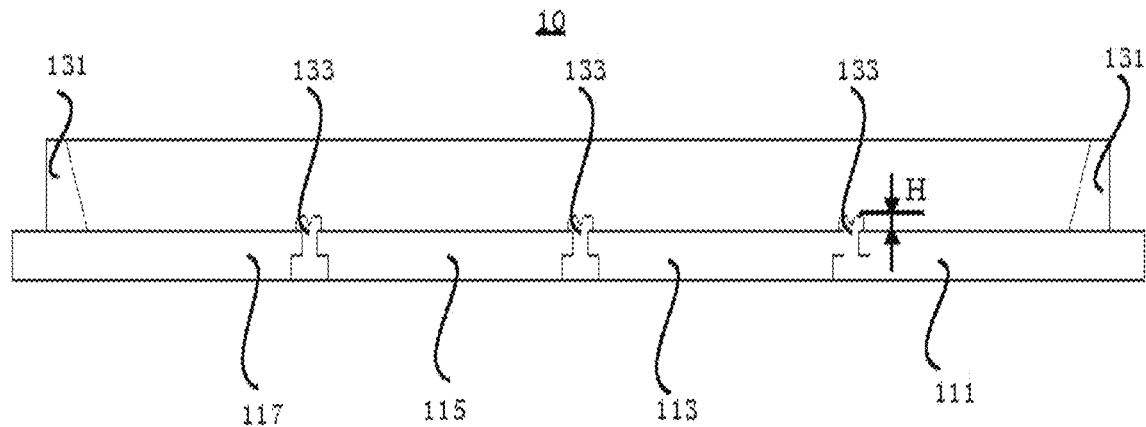
FIG. 1G is a partial cross-sectional view of a surface mounted type leadframe in another embodiment of the disclosure.

The insulating material layer 13 can include a peripheral section 131 and at least two intermediate sections 133. The peripheral section 131 at least partially covers the front surface of the conductive base 11, and the die bonding regions are surrounded by the peripheral section 131 and located in the peripheral section 131. As shown in FIG. 1C, each of the intermediate sections 133 is filled between any two adjacent connecting pads, such as in a gap between the connecting pad 111 and the connecting pad 113, in a gap between the connecting pad 113 and the connecting pad 115, in a gap between the connecting pad 115 and the connecting pad 117 shown in FIG. 1A. The intermediate sections 133 preferably are disposed to be extruded out from the front surfaces 1101 of the adjacent connecting pads, namely the height of the intermediate sections 133 is greater than that of the front surfaces 1101 of the adjacent connecting pads. In other words, each of the intermediate sections 133 includes a top surface 1331 and a bottom surface 1332, the bottom surface 1332 and the rear surfaces 1102 are coplanar, a distance between the top surface 1331 and the bottom surface 1332 is larger than a distance between the front surface 1101 and the rear surface 1102. A width of the bottom surface 1332 is larger than a width of the top surface 1331. Obviously, cross-sectional shapes of extrusion portions of the intermediate sections 133 higher than the front surfaces 1101 of the adjacent connecting pads taken along the line A in embodiments of the disclosure are not restricted to the approximate rectangle as shown in FIG. 1C. It can further be other shapes such as the approximate trapezium as shown in FIG. 1D, or the approximate triangle as shown in FIG. 1E, or the approximate rectangle with an inverted trapezoid groove defined in the middle of the upper surface thereof as shown in FIG. 1F, or the approximate rectangle with an inverted triangle groove defined in the middle of the upper surface thereof as shown in FIG. 1G. In other embodiments, the surface mounted type leadframe 10 can abandon the features "the intermediate sections 133 preferably are disposed to be extruded out of the front surfaces 1101 of adjacent connecting pads, namely the height of the intermediate sections 133 is greater than that of the front surfaces 1101 of adjacent connecting pads".

To be more specific, as shown in FIGS. 1C-1G, the cross-sectional shape of the intermediate sections 133 is a narrow section sandwiched by two wide sections (the upper section and the lower section in FIGS. 1C-1G), which is similar to a shape of the weights used cooperatively with a scale. Accordingly, the intermediate section 133 is embedded between two adjacent connecting pads for preventing moving up and down.

The material of the insulating material layer 13 can further be an insulating reflection material capable of reflecting rays. Specifically, the material of the insulating material layer 13 can be thermosetting materials such as epoxy molding compound (EMC), unsaturated polyester (UP) or silicone molding compound (SMC); the material of the insulating material layer 13 can further be thermoplastic materials such as polyphthalamide (PPA) or polylcyclolexylene dimethylene terephthalate (PCT).

It is worthy to be mentioned that each of the connecting pads 111, connecting pad 113, connecting pad 115 and connecting pad 117 is anode or cathode; at least one connecting pad of the connecting pads 111, connecting pad 113, connecting pad 115 and connecting pad 117 is anode while at least one connecting pad is cathode. When the number of connecting pads with the same polarity is more than one, the connecting pads with the same polarity are mutually communicated by connecting ribs. For instance, when the number of anode connecting pads is more than one, all the anode connecting pads are communicated by one connecting rib; when the number of cathode connecting pads is more than one, all the cathode connecting pads are communicated by another connecting rib. The material of connecting ribs can be identical to that of the connecting pads; moreover, the connecting ribs can be integrally formed with the connecting pads. In one embodiment, the conductive base 11 further includes at least one connecting rib.

Specifically, in the embodiment shown in FIG. 1A, FIG. 1B, and FIG. 1C, the connecting pad 111, the connecting pad 113, the connecting pad 115, and the connecting pad 117 can be anode, cathode, anode and cathode, respectively. The connecting pad 111 and the connecting pad 115 are communicated by a first connecting rib 1191 due to the same anode polarity therewith. The connecting pad 113 and the connecting pad 117 are communicated by a second connecting rib 1193 due to the same cathode polarity therewith. As long as the polarity of one connecting pad is known, the polarity of the other connecting pads communicated to the same connecting rib can be discovered because all the connecting pads communicated with the same connecting rib have the same polarity. Furthermore, it can be learnt from FIG. 1A and FIG. 1B that the first connecting rib 1191 and the second connecting rib 1193 respectively are located at two opposite sides of the conductive base 11, such as a top side and a bottom side in FIG. 1A. Preferably, anode connecting pads connecting pad and cathode connecting pads connecting pad are disposed alternately. Specifically, as shown in FIG. 1A, four connecting pads from right to left sequentially are anode, cathode, anode, and cathode, which are alternately disposed as "one anode by one cathode" or "one cathode by one anode". If the number of connecting pads included in the conductive base 11 is an even number larger than three, the number of anode connecting pads and the number of cathode connecting pads can be equal, to better alternately dispose the anode connecting pads and the cathode connecting pads. In another embodiment, if the number of the connecting pads with the same polarity is more than one, the connecting pads with the same polarity can further be communicated without the connecting rib. Specifically, each connecting pad can be connected to an anode electrode or a cathode electrode on the surface mounted type leadframe 10 by its own connecting portion.

To be more specific, the connecting pad 111, the connecting pad 115, and the first connecting rib 1191 can be an integral structure. The connecting pad 113, the connecting pad 117, and the second connecting rib 1193 can be an integral structure. The connecting pad 111, the connecting pad 113, the connecting pad 115, the connecting pad 117, the first connecting rib 1191, and the second connecting rib 1193 can be obtained by stamping or etching one conductive material sheet, wherein the conductive material can be metal such as copper, aluminum or the like. The insulating material layer 13 can be obtained by transfer molding or injection molding an insulating material onto corresponding positions after preparing the connecting pad 111, the connecting pad 113, the connecting pad 115, the connecting pad 117, the first connecting rib 1191, and the second connecting rib 1193 by stamping or etching one conductive material sheet. The insulating material can be epoxy molding compound (EMC).

The insulating material layer 13 can at least cover a portion of the first connecting rib 1191 and a portion of the second connecting rib 1193, namely a front surface of the first connecting rib 1191 and a front surface of the second connecting rib 1193 can be failed in being thoroughly covered by the insulating material layer 13. So, the front surface of the first connecting rib 1191 and that of the second connecting rib 1193 both have exposed portions 110 uncovered by the insulating material layer 13. The exposed portions 110 can conveniently dissipate heat from the first connecting rib 1191 and the second connecting rib 1193 into the ambience.

As shown in FIG. 1A, four lateral sides of the front surface of the conductive base 11, such as the top side, the bottom side, the left side, and the right side of the conductive base 11 in FIG. 1A, each defines one exposed portion 110 uncovered by the insulating material layer 13, thereby better dissipating heat from the conductive base 11 into the ambience. In other words, at least a portion of the first connecting rib 1191 is positioned outside of the peripheral section 133, at least a portion of the second connecting rib 1193 is positioned outside of the peripheral section 133, a portion of the first surface of the leftmost connecting pad 117 is positioned outside of the peripheral section 133, and a portion of the first surface of the rightmost connecting pad 111 is positioned outside of the peripheral section 133.

As shown in FIG. 1C, a height H of the intermediate sections 133 extruded out from the front surfaces 1101 (or upper surfaces) of the connecting pads 111, 113, 115 and 117 is no less than 50 microns. Preferably, the height H of the intermediate sections 133 extruded out of front surfaces 1101 of the connecting pads 111, 113, 115 and 117 is in a range of 50 microns-100 microns, which is benefit for balancing the superior luminance and the stronger adhesion.

Furthermore, the size of the surface mounted type leadframe 10 can be 13 millimeters*13 millimeters. Apparently, the surface mounted type leadframe 10 in the embodiment of the disclosure is not restricted to the size mentioned above, it can further be other proper sizes according to requirements.

The intermediate sections 133 are extruded out of the front surfaces 1101 of the connecting pads 111, 113, 115, and 117, so as to raise the adhesion of packaging material such as silicone glue paved on the conductive base 11 and the insulating material layer 13.

As the entire conductive base 11 includes numerous connecting pads, the rear surfaces 1102 of the numerous connecting pads respectively are configured to form soldering regions. That means the soldering pad of the surface mounted type leadframe is divided into multiple soldering regions, so that the size of each soldering region is relatively small. Therefore, the bubbles generated due to flux volatilization in reflow soldering are more easily discharged, and thereby reducing the void ratio, as well as enhancing heat dissipation effects.

Overall, the redesign of the structure of the surface mounted type leadframe 10 according to the first embodiment of the disclosure above can improve the adhesion between the surface mounted type leadframe and the packaging material such as silicone glue, reduce the possibility of delamination and the void ratio of the solder paste during reflow soldering of the surface mounted type leadframe, and improve the heat dispassion effect and/or achieve the die bonding and wire bonding design under low voltages.

Second Embodiment

Figure 2:
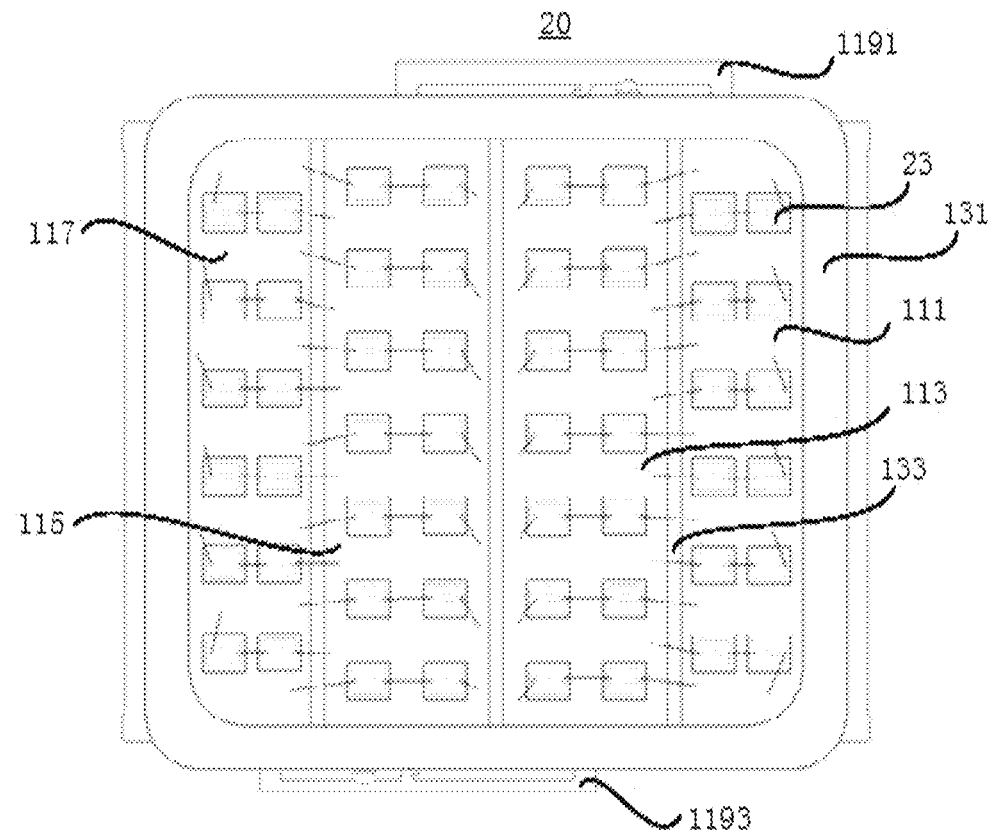
FIG. 2 is a structural schematic view of a photoelectric device with multi-chips in a second embodiment of the disclosure.

As shown in FIG. 2, a multi-chips photoelectric device 20 provided by the second embodiment of the disclosure primarily includes numerous photoelectric chips such as multiple LED chips 23 and a surface mounted type leadframe. The surface mounted type leadframe can be the surface mounted type leadframe 10 as described in the first embodiment above, whose concrete structure and functions can be referred to the illustration in the first embodiment without repeat herein. The LED chips 23 can be disposed in the die bonding regions of the surface mounted type leadframe.

The size of the surface mounted type leadframe can be 13 millimeters*13 millimeters. The numerous chips 23 can include fifty-two (twenty-six pairs) LED chips 23, and can adopt a design of 26 parallel connections and 2 series connections, which means that two LED chips in each pair of LED chips 23 are in series connection and subsequently twenty-six pairs of LED chips 23 are parallel connected. Specifically, as shown in FIG. 2, the die bonding region of each connecting pad is disposed with two columns of LED chips 23; the two LED chips 23 in the same row within the die bonding region of each connecting pad are bonded in a manner of series connection to form a LED chip pair; all the series connected LED chip pairs are further parallel connected. The voltage of each LED chip 23 can be 3V, and the photoelectric device with multi-chips 20 shown in FIG. 2 can achieve the low voltage design as 6V.

Figure 3:
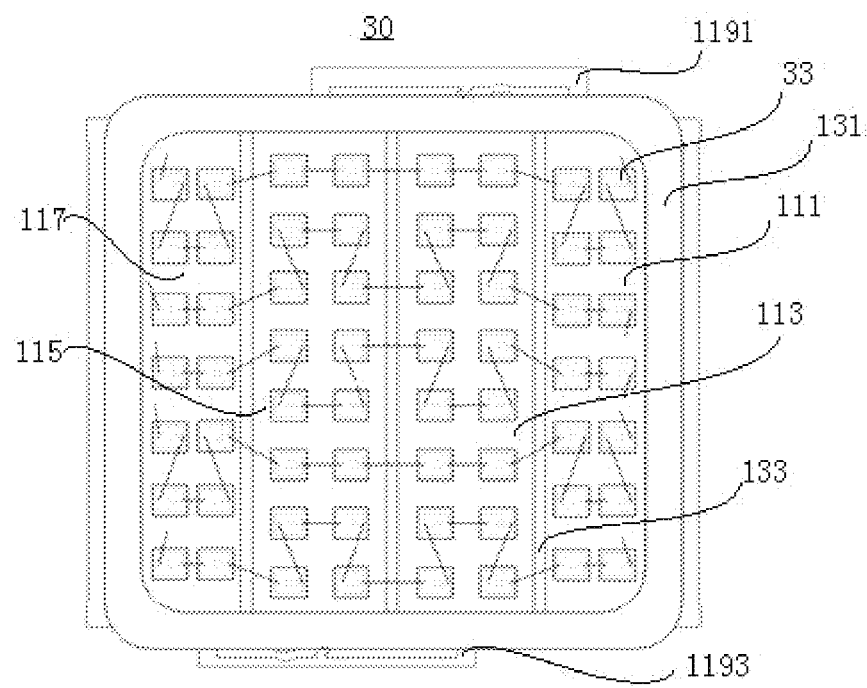
FIG. 3 is a structural schematic view of a photoelectric device with multi-chips in another embodiment of the disclosure.

The embodiment of the disclosure will apparently not be restricted to the design of "26 parallel connections and 2 series connections" as shown in FIG. 2, in other embodiments, the design can further be "5 parallel connections and 12 series connections" as shown in FIG. 3. That means twelve LED chips 33 are bonded in a form of series connection to form a LED chip group and then five LED chip groups are parallel connected. The voltage of each LED chip 33 can be 3V, and the photoelectric device with multi-chips 30 shown in FIG. 3 can fulfill the 36V design.

It is worthy to be mentioned that the size of the surface mounted type leadframe is not restricted to 13 millimeters*13 millimeters, it can further be other proper sizes according to requirements. Obviously, as the size of the LED chip 23 and the size of the surface mounted type leadframe will be different, the number of LED chips 23 disposed thereon can be various.

As the polarities of the connecting pad 111, the connecting pad 113, the connecting pad 115, and the connecting pad 117 are alternately disposed, the length of the wires among the LED chips 23 can be reduced, which is capable of enhancing the performance of the photoelectric device with multi-chips 20.

Overall, the photoelectric device with multi-chips such as the photoelectric device with multi-chips 20 of the second embodiment of the disclosure can be redesigned aiming at the structure of the surface mounted type leadframe included therein to reduce the void ratio of the solder paste during reflow soldering of the surface mounted type leadframe for improving the heat dispassion effect and enhance the adhesion between the surface mounted type leadframe and packaging materials such as silicone glue to reduce the possibility of delamination, and/or fulfilling the die bonding and wire bonding design under low voltages.

In the embodiments of the disclosure, comprehensively, the disclosed system, device and method can be achieved in other manners. For instance, the aforementioned devices merely are exemplary; the division of components purely is the logically functional division, and the practical fulfillment can be other divided manners, such as multiple components or assemblies can be combined or integrated in another system, or some features can be omitted, or unexecuted. Moreover, the displayed or discussed mutual coupling, direct coupling or communication can be indirect coupling or communication by ports, devices or components, electrically, mechanically or in other manners.

The illustrated separated components can be physically individual or not; the component can be a physical component or not, which can be located at the same position, or distributed on multi-networks. Some or all of the components can be selected according to the practical requirement to chase the objective of the embodiments of the disclosure.

The embodiments above are solely for illustrating technical solutions of the disclosure rather than limiting thereto; even though the disclosure has been introduced in detail with reference to the embodiments above, a person skilled in the art can understand the technical solutions recorded in the embodiments above can be modified, or some of the features therein can be replaced; but the modification or replacement will not lead to the essence of the corresponding technical solution to be excluded from the spirit and scope of the technical solutions of the embodiments of the disclosure.

What is claimed is:

1. A surface mounted type leadframe, comprising:
a conductive base, comprising at least three connecting pads, wherein the at least three connecting pads are mutually spaced apart from each other, first surfaces of the at least three connecting pads are configured to form die bonding regions, second surfaces of the at least three connecting pads opposite to the first surfaces are configured to form soldering regions, the connecting pads comprise at least one anode connecting pad and at least two cathode connecting pads; and
an insulating material layer, covering at least a portion of the first surfaces, surrounding the die bonding regions, and being filled in gaps between each two adjacent connecting pads;
wherein the at least three connecting pads comprise even connecting pads, a half of the even connecting pads are anode connecting pads and the other half are cathode connecting pads.

2. The surface mounted type leadframe according to claim 1, wherein the at least three connecting pads comprise a plurality of anode connecting pads and a plurality of cathode connecting pads.

3. The surface mounted type leadframe according to claim 2, wherein the conductive base further comprises two connecting ribs respectively located at two opposite sides thereof, the plurality of anode connecting pads are communicated with each other by one of the two connecting ribs, and the plurality of cathode connecting pads are communicated with each other by the other one of the two connecting ribs.

4. The surface mounted type leadframe according to claim 1, wherein the at least one anode connecting pad and the at least two cathode connecting pads are alternately arranged along a line.

5. The surface mounted type leadframe according to claim 1, wherein the conductive base further comprises at least one connecting rib, and the connecting pads with an identical polarity are communicated with each other by one of the at least one connecting rib.

6. The surface mounted type leadframe according to claim 5, wherein the insulating material layer at least covers a portion of the at least one connecting rib, four lateral sides of the conductive base each define a exposed portion uncovered by the insulating material layer.

7. A surface mounted type leadframe, comprising:
a conductive base, comprising a plurality of connecting pads, wherein first surfaces of the plurality of connecting pads are configured to form die bonding regions, second surfaces of the plurality of connecting pads opposite to the first surfaces are configured to form soldering regions; and an insulating material structure, comprising a peripheral section and a plurality of intermediate sections, wherein the peripheral section covers a portion of the first surfaces and surrounds the die bonding regions, the intermediate sections each are filled in a gap between each two adjacent connecting pads and extruded out from the first surfaces;

wherein the plurality of connecting pads are arranged along a line and are equally spaced from each other.

8. The surface mounted type leadframe according to claim 7, wherein a height of the intermediate sections extruded out from the first surfaces of the plurality of connecting pads is in a range of 50 microns to 100 microns.

9. The surface mounted type leadframe according to claim 8, wherein the first surfaces of the plurality of connecting pads are coplanar, and the second surfaces of the plurality of connecting pads are coplanar.

10. The surface mounted type leadframe according to claim 7, wherein the plurality of connecting pads comprise a plurality of anode connecting pads and a plurality of cathode connecting pads, the anode connecting pads and the cathode connecting pads are alternately arranged.

11. The surface mounted type leadframe according to claim 10, wherein the conductive base further comprises a first connecting rib and a second connecting rib, the first connecting rib is positioned at a top side of the connecting pads and electrically connected to each of the anode connecting pads, the second connecting rib is positioned at a bottom side of the connecting pads and electrically connected to each of the cathode connecting pads.

12. The surface mounted type leadframe according to claim 11, wherein at least a portion of the first connecting rib is positioned outside of the peripheral section, and at least a portion of the first connecting rib is positioned outside of the peripheral section.

13. The surface mounted type leadframe according to claim 12, wherein a portion of the first surface of the leftmost one of the connecting pads is positioned outside of the peripheral section, and a portion of the first surface of the rightmost one of the connecting pads is positioned outside of the peripheral section.

14. The surface mounted type leadframe according to claim 7, wherein the number of the anode connecting pads is equal to the number of the cathode connecting pads.

15. A photoelectric device with multi-chips, comprising:
a surface mounted type leadframe, comprising:
a conductive base, comprising a plurality of anode connecting pads, a plurality of cathode connecting pads, a first connecting rib, and a second connecting rib, wherein the anode and the cathode connecting pads are alternately arranged and are spaced positioned along a line, each of the anode and the cathode connecting pads comprises a first surface and a second surface opposite to the first surface, each first surface defines a die bonding region;

an insulating material structure, comprising a peripheral section and a plurality of intermediate sections, the intermediate sections and the die bonding regions are positioned in and surrounded by the peripheral section, each of the intermediate sections is filled between and connected with two adjacent connecting pads, each of the intermediate sections comprises a top surface and a bottom surface, the bottom surface and the second surfaces are coplanar, a distance between the top surface and the bottom surface is larger than a distance between the first surface and the second surface;

a plurality of photoelectric chips, disposed in the die bonding regions of the surface mounted type leadframe and surrounded by the peripheral section.

16. The photoelectric device with multi-chips according to claim 15, wherein the first surfaces are coplanar, and a width of the bottom surface is larger than a width of the top surface.

17. The photoelectric device with multi-chips according to claim 16, wherein the conductive base further comprises a first connecting rib and a second connecting rib, the first connecting rib is positioned at a top side of the connecting pads and electrically connected to each of the anode connecting pads, the second connecting rib is positioned at a bottom side of the connecting pads and electrically connected to each of the cathode connecting pads, at least a portion of the first connecting rib is positioned outside of the peripheral section, and at least a portion of the first connecting rib is positioned outside of the peripheral section.

18. The photoelectric device with multi-chips according to claim 17, wherein each of the die bonding regions is disposed with two columns of photoelectric chips, the two photoelectric chips in the same row within the die bonding region are bonded in a manner of series connection to form a photoelectric chip pair, and all the series connected photoelectric chip pairs are further parallel connected.

* * * * *